(12) United States Patent
Kao et al.

(10) Patent No.: US 9,589,820 B2
(45) Date of Patent: Mar. 7, 2017

(54) SEMICONDUCTOR APPARATUS AND ADJUSTMENT METHOD

(71) Applicant: Taiwan Semiconductor Manufacturing Co., Ltd, Hsin-Chu (TW)

(72) Inventors: Yao-Hwan Kao, Baoshan Shiang (TW); Ching-Hai Yang, Taipei (TW); Po-Chun Lee, Hsinchu (TW)

(73) Assignee: TAIWAN SEMICONDUCTOR MANUFACTURING CO., LTD., Hsin-Chu (TW)

( * ) Notice: Subject to any disclaimer, the term of this patent is extended or adjusted under 35 U.S.C. 154(b) by 0 days.

(21) Appl. No.: 14/725,317

(22) Filed: May 29, 2015

(65) Prior Publication Data
US 2016/0351420 A1 Dec. 1, 2016

(51) Int. Cl.
| | |
|---|---|
| *H01L 21/67* | (2006.01) |
| *H01L 21/683* | (2006.01) |
| *H01L 51/00* | (2006.01) |
| *B41J 3/44* | (2006.01) |
| *B82Y 30/00* | (2011.01) |
| *H01L 21/02* | (2006.01) |

(52) U.S. Cl.
CPC ........ *H01L 21/67288* (2013.01); *B41J 3/445* (2013.01); *B82Y 30/00* (2013.01); *H01L 21/02282* (2013.01); *H01L 21/02288* (2013.01); *H01L 21/6708* (2013.01); *H01L 21/6715* (2013.01); *H01L 21/67017* (2013.01); *H01L 21/67253* (2013.01); *H01L 21/67276* (2013.01); *H01L 21/6831* (2013.01); *H01L 51/0005* (2013.01)

(58) Field of Classification Search
None
See application file for complete search history.

(56) References Cited

U.S. PATENT DOCUMENTS

| | | | |
|---|---|---|---|
| 2011/0286738 A1* | 11/2011 | Noda | H01L 21/67253 396/611 |
| 2012/0090547 A1 | 4/2012 | Wang et al. | |
| 2014/0190634 A1 | 7/2014 | Huang et al. | |

* cited by examiner

*Primary Examiner* — Jiong-Ping Lu
(74) *Attorney, Agent, or Firm* — McClure, Qualey & Rodack, LLP

(57) ABSTRACT

A semiconductor apparatus is provided. The semiconductor apparatus includes a wafer chuck configured to hold a wafer, and a first nozzle configured to dispense first chemical liquid onto the wafer. The semiconductor apparatus also includes a second nozzle configured to dispense second chemical liquid onto the wafer at a first dispensing time after the first nozzle stops dispensing the first chemical liquid. The semiconductor apparatus also includes an image device configured to take images of the first nozzle and the second nozzle in sequence, and a processing module configured to analyze the images. The processing module adjusts the first dispensing time when a first defect image shows the first chemical liquid and the second chemical liquid existing in a space close to the first and the second nozzles and flowing to the wafer.

19 Claims, 10 Drawing Sheets

SEMICONDUCTOR APPARATUS AND ADJUSTMENT METHOD

BACKGROUND

Semiconductor devices are used in a variety of electronic applications, such as personal computers, cell phones, digital image devices, and other electronic equipment. Semiconductor devices are typically fabricated by sequentially depositing insulating or dielectric layers, conductive layers, and semiconductive layers of material over a wafer, and patterning the various material layers using lithography process to form circuit components and elements thereon. Many integrated circuits are typically manufactured on a single wafer, and individual dies on the wafer are singulated by sawing between the integrated circuits along a scribe line. The individual dies are typically packaged separately, in multi-chip modules, or in other types of packaging, for example.

When a semiconductor apparatus performs semiconductor manufacturing processes on wafers, some defects may be formed on the wafers, and thus the yield rate of the wafers is decreased by the defects. Therefore, the semiconductor apparatus needs to be maintained frequently, and the manufacturing efficiency of the wafer is decreased.

Although existing semiconductor apparatuses have been generally adequate for their intended purposes, they have not been entirely satisfactory in all respects. Consequently, it would be desirable to provide a solution for decreasing the defects and the time required for the maintenance of the semiconductor apparatuses.

BRIEF DESCRIPTION OF THE DRAWINGS

Aspects of the present disclosure are best understood from the following detailed description when read with the accompanying figures. It should be noted that, in accordance with standard practice in the industry, various features are not drawn to scale. In fact, the dimensions of the various features may be arbitrarily increased or reduced for clarity of discussion.

DETAILED DESCRIPTION

Figure 1:
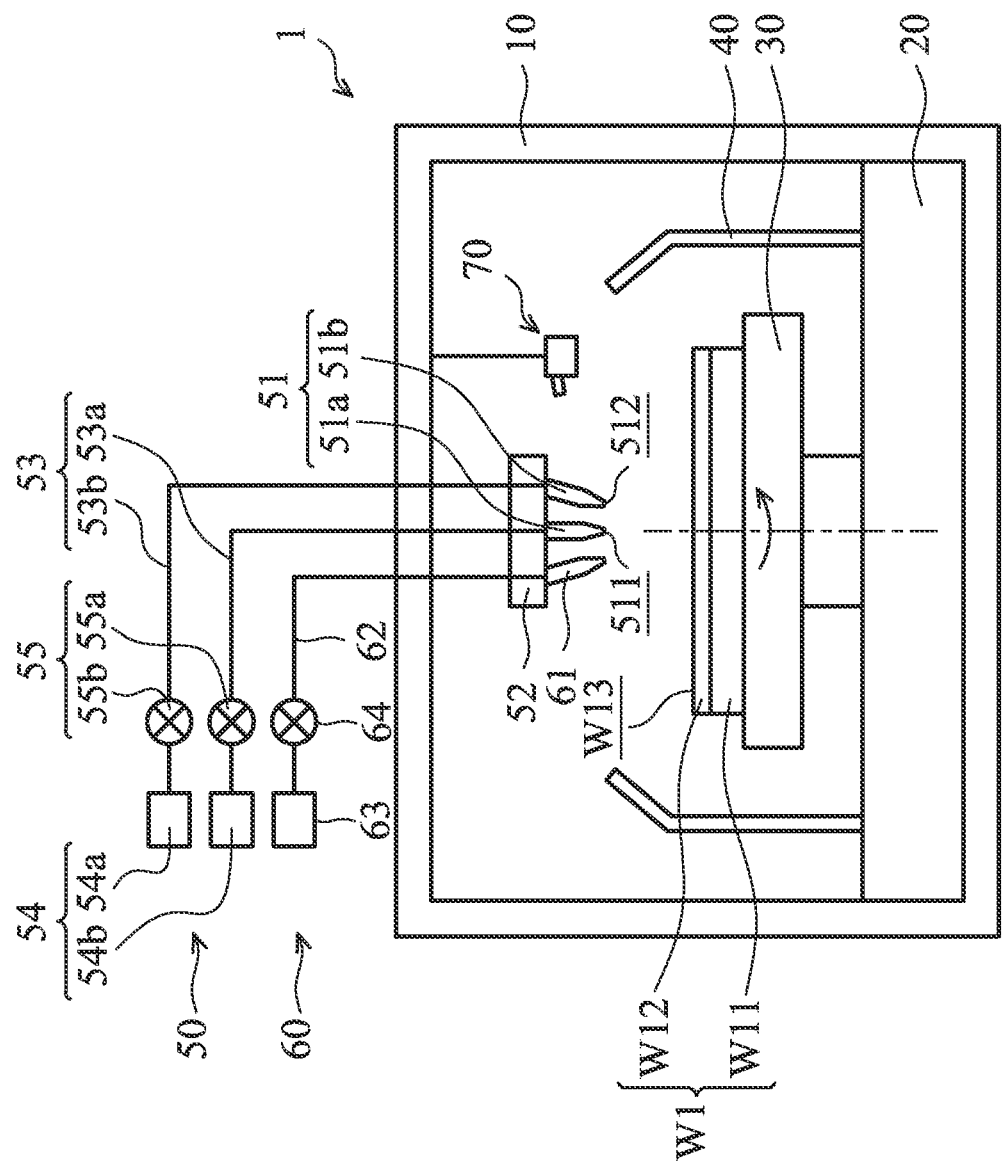
FIG. 1 is a schematic view of a semiconductor apparatus in accordance with some embodiments of the disclosure.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Some variations of the embodiments are described. Throughout the various views and illustrative embodiments, like reference numbers are used to designate like elements. It should be understood that additional operations can be provided before, during, and after the method, and some of the operations described can be replaced or eliminated for other embodiments of the method.

A semiconductor apparatus and an adjustment method for the semiconductor apparatus are provided. The semiconductor apparatus is configured to perform a semiconductor manufacturing processes on a wafer. The adjustment method is configured to adjust a liquid supply device of the semiconductor apparatus.

In some embodiments, the semiconductor apparatus is a chemical mechanical polishing (CMP) apparatus, a developing apparatus, a coating apparatus, a wafer cleaning apparatus, a wet etching apparatus, or another suitable apparatus. In some embodiments, the semiconductor manufacturing process is a CMP process, a developing process, a coating process, a wafer cleaning process, a wet etching process, or another suitable process.

FIG. 1 is a schematic view of a semiconductor apparatus 1 in accordance with some embodiments of the disclosure. In some embodiments, the semiconductor apparatus 1 is a developing apparatus. The semiconductor apparatus 1 includes a process chamber 10, a stage 20, a wafer chuck 30, a cup 40, liquid supply devices 50 and 60, and an image device 70. The stage 20 is disposed in the process chamber 10, and located at the bottom of the process chamber 10.

The wafer chuck 30 is disposed on the stage 20. The wafer chuck 30 is configured to hold and rotate a wafer W1. In some embodiments, the wafer chuck 30 is an electrostatic wafer chuck. In some embodiments, the wafer W1 includes a substrate W11 and a processing layer W12.

In some embodiments, the processing layer W12 is a photoresist layer coated by a coating process. In some embodiments, the processing layer W12 is a conductive layer including metal. In some embodiments, the processing layer W12 is a dielectric layer including insulated material.

The cup 40 is a hollow columnar structure. The wafer chuck 30 and the wafer W1 are located in the cup 40. The cup 40 is higher than the wafer relative to the stage 20 during the semiconductor manufacturing process. The cup 40 is configured to block liquid spaying from the wafer W1.

The liquid supply device 50 includes nozzles 51, a holder 52, tubes 53, tanks 54, and flow controllers 55. The nozzles 51 are configured to dispense chemical liquid to the wafer W1. In some embodiments, the nozzles 51 alternatively dispense the chemical liquid on the processing layer W12 of the wafer W1 in sequence. In some embodiments, the number of nozzles 51 is in a range from about 2 to about 50. The nozzles 51 are disposed on the holder 52. The nozzles 51 are connected to the tanks 54 via the tubes 53.

In some embodiments, the chemical liquid is developing liquid. In some embodiments, the developing liquid includes DMSO (dimethyl sulfoxide), MEA (methyl ethyl amide), BDG (diethylene glycol monobutyl ether)), NEA (n,n-dimethylacetamide), NMP (n-methyl pyrrolidone), or the mixture thereof.

In some embodiments, the chemical liquid is photoresist. In some embodiments, the photoresist liquid is a positive photoresist liquid including phenol-formaldehyde resin, epoxy resin, or the mixture thereof. In some embodiments, the photoresist liquid is a negative photoresist liquid including natural rubber, polyisoprene rubber, polybutadiene rubber, or the mixture thereof.

In some embodiments, the etching liquid is HCl, HF, $H_2SO_4$, $H_3PO_4$, $HNO_3$, $HClO_4$, CH3COOH, and $NH_4OH$, or the mixture thereof.

The tanks 54 are configured to contain various kinds of chemical liquid. The flow controllers 55 are connected to the tubes 53. The flow controllers 55 are configured to apply the chemical liquid in the tanks 54 to the nozzles 51. In some embodiments, the flow controllers 55 are valves or pumps.

The liquid supply device 60 includes a nozzle 61, a tube 62, a tank 63, and a flow controller 64. The nozzle 61 is configured to dispense washing liquid to the wafer W1. In some embodiments, the nozzle 61 is disposed on the holder 52. The nozzle 61 is connected to the tank 63 via a tube 62. The tank 63 is configured to contain the washing liquid. The flow controller 64 is configured to apply the washing liquid in the tank 54 to the nozzle 61.

In some embodiments, the washing liquid is water, such as deionized water (DI water), or another chemical liquid which can clean effectively.

The image device 70 is located in the process chamber 10. In some embodiments, the image device 70 is disposed on the wall of the process chamber 10. In some embodiments, the image device 70 is disposed on the holder 52. In some embodiments, the image device 70 is a camera. The image device 70 is configured to take images of the nozzles 51 and the nozzle 61.

In some embodiments, some portions of the processing layer W12 are removed by at least two kinds of chemical liquid. In some embodiments, another layer, such as a photoresist layer, is formed on the processing layer W1 by at least two kinds of chemical liquid.

In some embodiments, the nozzles 51 include a first nozzle 51a and a second nozzle 51b. The first nozzle 51a is configured to dispense first chemical liquid on the wafer W1. The first nozzle 51a is connected to a first tank 54a by a first tube 53a. The first tank 54a contains the first chemical liquid. A flow controller 55a transmits the first chemical liquid from the first tank 54a to the first nozzle 51a.

The second nozzle 51b is configured to dispense second chemical liquid on the wafer W1. In some embodiments, the kind of the first chemical liquid is different from the kind of the second chemical liquid. The second nozzle 51b is connected to a second tank 54b by a second tube 53b. The second tank 54b contains the second chemical liquid. A flow controller 55b transmits the second chemical liquid from the second tank 54b to the second nozzle 51b.

As shown in FIG. 1, during a semiconductor manufacturing process, such as a developing process, the wafer W1 is held on the wafer chuck 30. The first nozzle 51a and the second nozzle 51b are moved to a dispensing position close to the wafer W1. In some embodiments, the first nozzle 51a and the second nozzle 51b are moved to the dispensing position over the central area of the wafer W1. In other words, the first nozzle 51a and the second nozzle 51b are located over the central area of the wafer W1. Moreover, the wafer W1 is rotated by the wafer chuck 30.

As shown in FIG. 1, the first nozzle 51a dispenses the first chemical liquid on the wafer W1. Since the wafer W1 is rotated, the first chemical liquid is distributed on the processing layer W12. In some embodiments, the first chemical liquid reacts with some portions of the processing layer W12. In some embodiments, some portions of the processing layer W12 are dissolved by the first chemical liquid.

After the first chemical liquid stops dispensing the first chemical liquid, the second chemical liquid starts to dispense the second chemical liquid on the wafer W1. Since the wafer W1 is rotated, the second chemical liquid is distributed on the processing layer W12.

In some embodiments, the second chemical liquid is mixed with the first chemical liquid on wafer W1. In some embodiments, the second chemical liquid reacts with the first chemical liquid and/or the processing layer W12 on the wafer W1. In some embodiments, some portions of the processing layer W12 are dissolved by the second chemical liquid.

In some embodiments, the nozzles 51 include at least two first nozzles 51a arranged on a plane along a direction. In some embodiments, the nozzles 51 include at least two second nozzles 51b arranged on a plane, along a direction. During a semiconductor manufacturing process, such as a developing process, the first nozzles 51a or the second nozzles 51b are moved horizontally to dispense the chemical liquid to the edge area and the central area of the wafer W1.

In some embodiments, after the chemical liquid reacts with some portions of the processing layer W12, the portions of processing layer W12 dissolved by the chemical liquid. The nozzle 61 is moved to the center area of the wafer W1. In other words, the nozzle 61 is located over the center area of the wafer W1.

The nozzle 61 dispenses the washing liquid on the wafer W1. Since the wafer W1 is rotated, the washing liquid washes the surface of the wafer W1, and removes the chemical liquid on the wafer W1.

Figure 2:
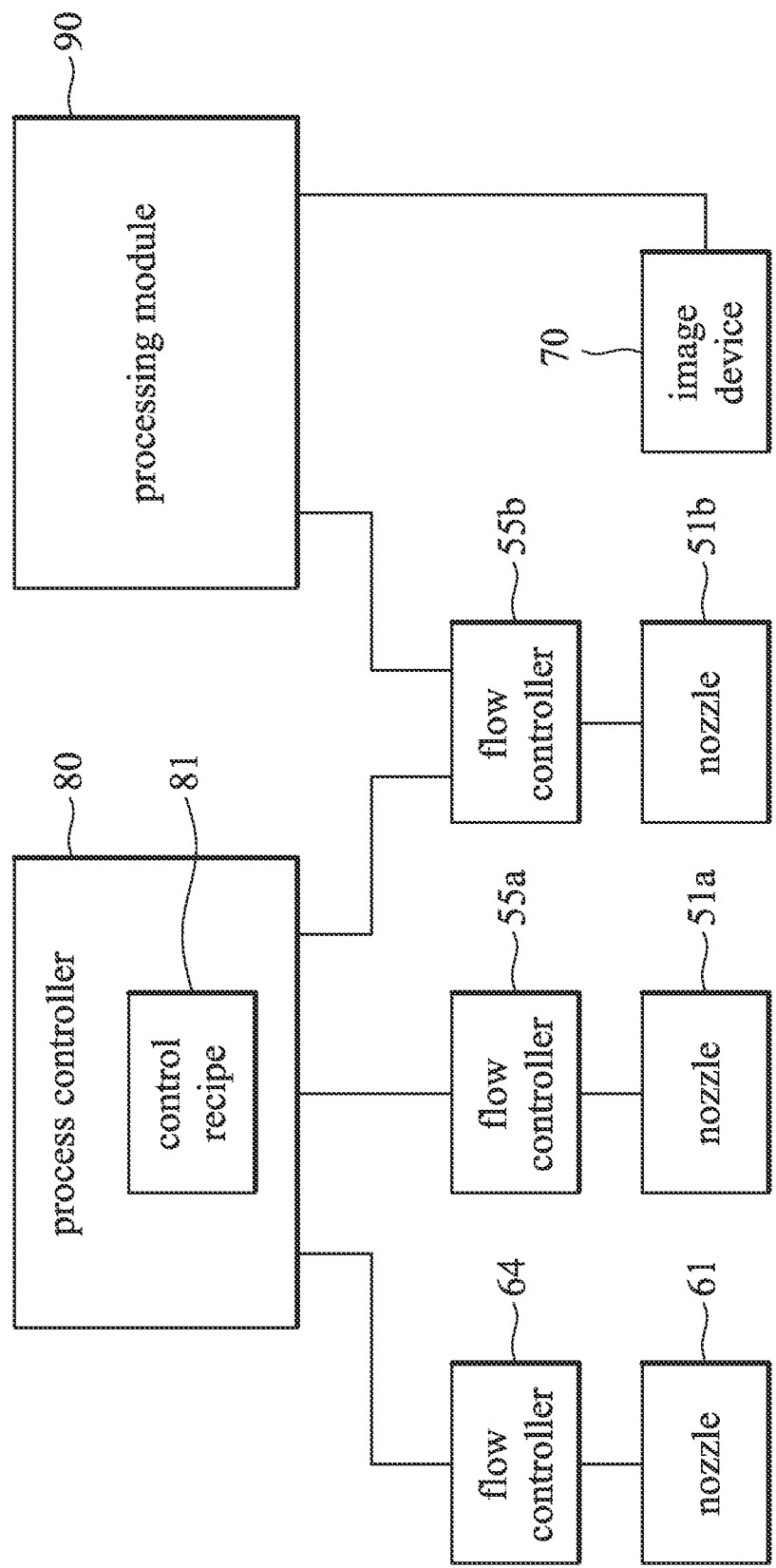
FIG. 2 is a system diagram of the semiconductor apparatus in accordance with some embodiments of the disclosure.
Figure 3:
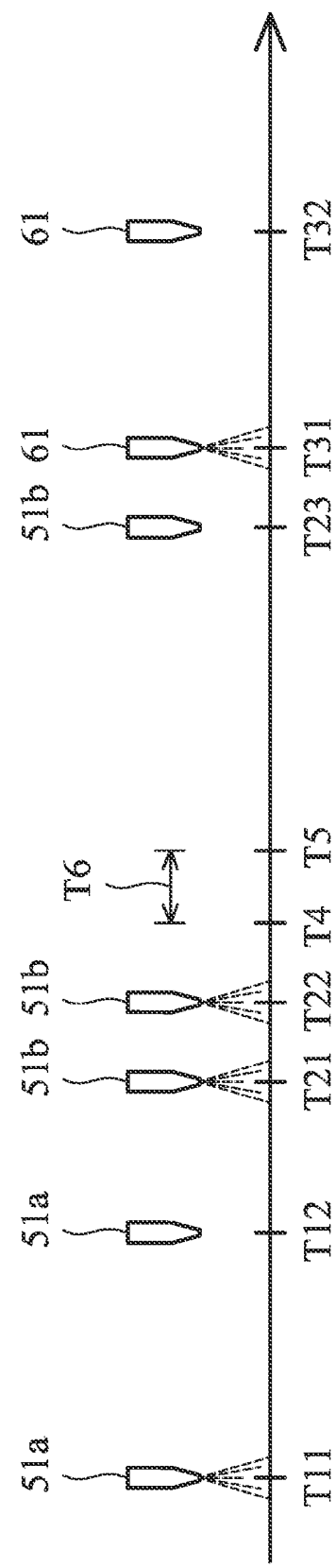
FIG. 3 is a timing diagram of the adjustment method for the semiconductor apparatus in accordance with some embodiments of the disclosure.

FIG. 2 is a system diagram of the semiconductor apparatus 1 in accordance with some embodiments of the disclosure. FIG. 3 is a timing diagram of the adjustment method for the semiconductor apparatus 1 in accordance with some embodiments of the disclosure. The semiconductor apparatus 1 further includes a process controller 80 and a processing module 90. The process controller 80 is electrically connected to the processing module 90, the flow controllers 55a and 55b, and the flow controller 64.

The process controller 80 is configured to control the flow controller 55a starting to apply the first chemical liquid to the first nozzle 51a at a first starting time, and controls the flow controller 55a to stop applying the first chemical liquid to the first nozzle 51a at a first stopping time T12. Therefore, the first nozzle 51a starts to dispense the first chemical liquid to the wafer W1 at the starting time T11, and the first nozzle 51a stops dispensing the first chemical liquid to the wafer W1 at the first stopping time T12.

Moreover, the process controller 80 is configured to control the flow controller 55a to draw back a volume of the first chemical liquid from the first nozzle 51a via the first tube 53a when the first nozzle 51a stops dispensing the first chemical liquid.

The process controller 80 is also configured to control the flow controller 55b starting to apply the second chemical liquid to the second nozzle 51b at a first dispensing time T21, and controls the flow controller 55b to stop applying the second chemical liquid to the second nozzle 51b at a second stopping time T23. The first dispensing time T21 is later than the first stopping time T12. Therefore, the second nozzle 51b starts to dispense the second chemical liquid to the wafer W1 at the first dispensing time T21, and the second nozzle 51b stops dispensing the second chemical liquid to the wafer W1 at the second stopping time T23.

Moreover, the process controller 80 is configured to control the flow controller 55b to draw back a volume of the second chemical liquid from the second nozzle 51b via the second tube 53b when the second nozzle 51b stops dispensing the second chemical liquid.

The process controller 80 is also configured to control the flow controller 64 starting to apply the washing liquid to the nozzle 61 at a starting time T31, and controls the flow controller 64 to stop applying the washing liquid to the nozzle 61 at a third stopping time T32. Therefore, the nozzle 61 starts to dispense the washing liquid to the wafer W1 at the starting time T31, and the nozzle 61 stops dispensing the washing liquid to the wafer W1 at the third stopping time T32.

In some embodiments, the process controller 80 is configured to control the flow controller 64 to draw back a volume of the washing liquid from the nozzle 61 via the tube 62 when the nozzle 61 stops dispensing the washing liquid.

In some embodiments, the process controller 80 includes a control recipe 81 that includes information such as the starting time T11, the first stopping time T12, the first dispensing time T21, the starting time T31, and the third stopping time T32.

The processing module 90 is electrically connected to the process controller 80, the flow controller 55b, and the image device 70. In some embodiments, the processing module 90 is integrated with the process controller 80. The processing module 90 is configured to receive the images from the image device 70, and analyze the images.

In some embodiments, the processing module 90 receives the control recipe 81 from the process controller 80 to get information on the starting time T11, the first stopping time T12, the first dispensing time T21, the starting time T31, and the third stopping time T32.

The processing module 90 is also configured to adjust the first dispensing time T21 to a second dispensing time T22 according to the analyzing result of the image device 70. Therefore, the second nozzle 51b starts to dispense the second chemical liquid to the wafer W1 at the second dispensing time T22 in a subsequent semiconductor manufacturing process.

Moreover, the processing module 90 is configured to adjust the volume drawing from the first nozzle 51a, the second nozzle 51b or the nozzle 61 by the flow controllers 55a and 55b, or the flow controller 64.

Figure 4:
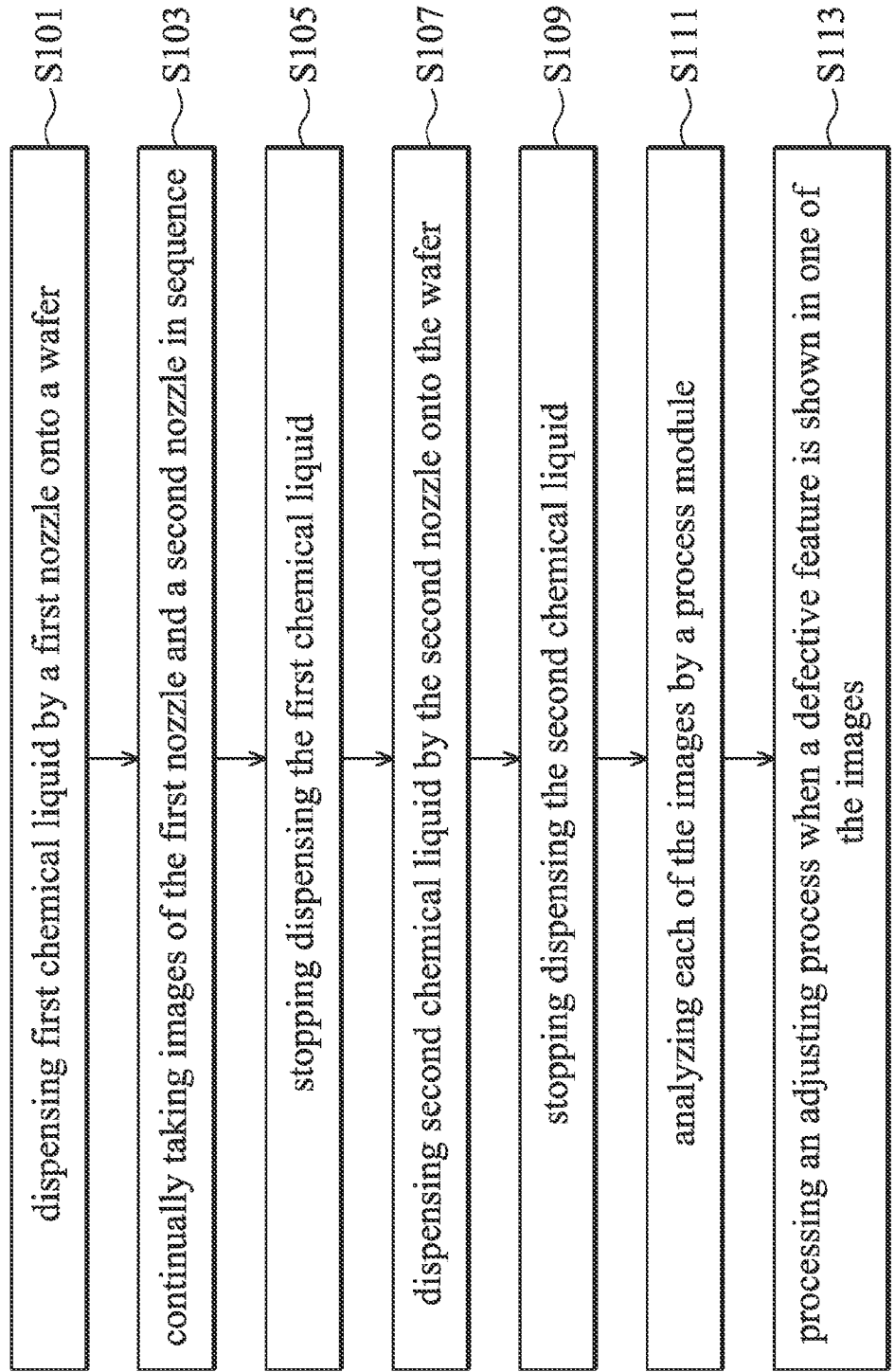
FIG. 4 is a flow chart of an adjustment method for the semiconductor apparatus in accordance with some embodiments of the disclosure.
Figure 5A:
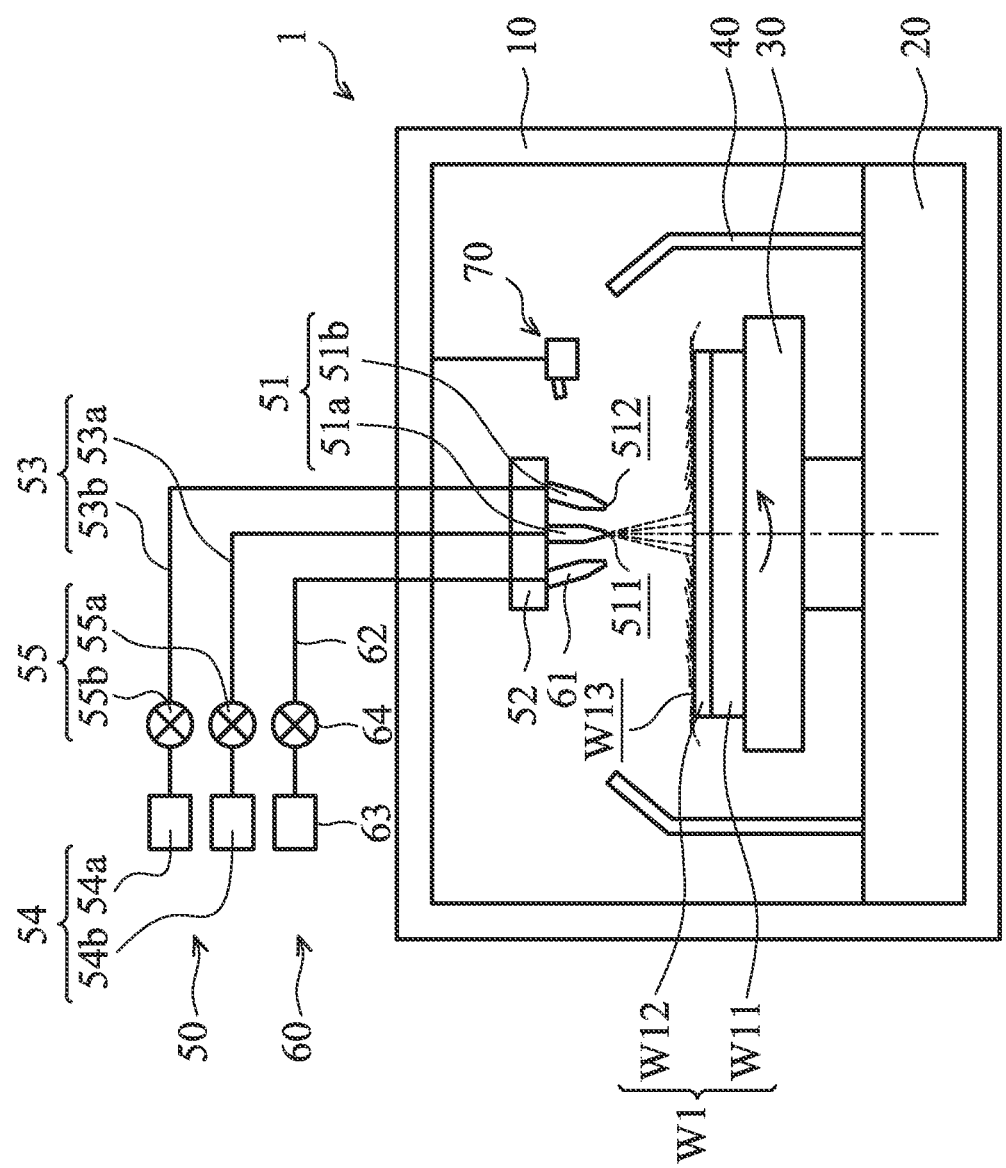
FIGS. 5A to 5C are schematic views of the semiconductor apparatus during an intermediate stage of the adjustment method in accordance with some embodiments of the disclosure.
Figure 5B:
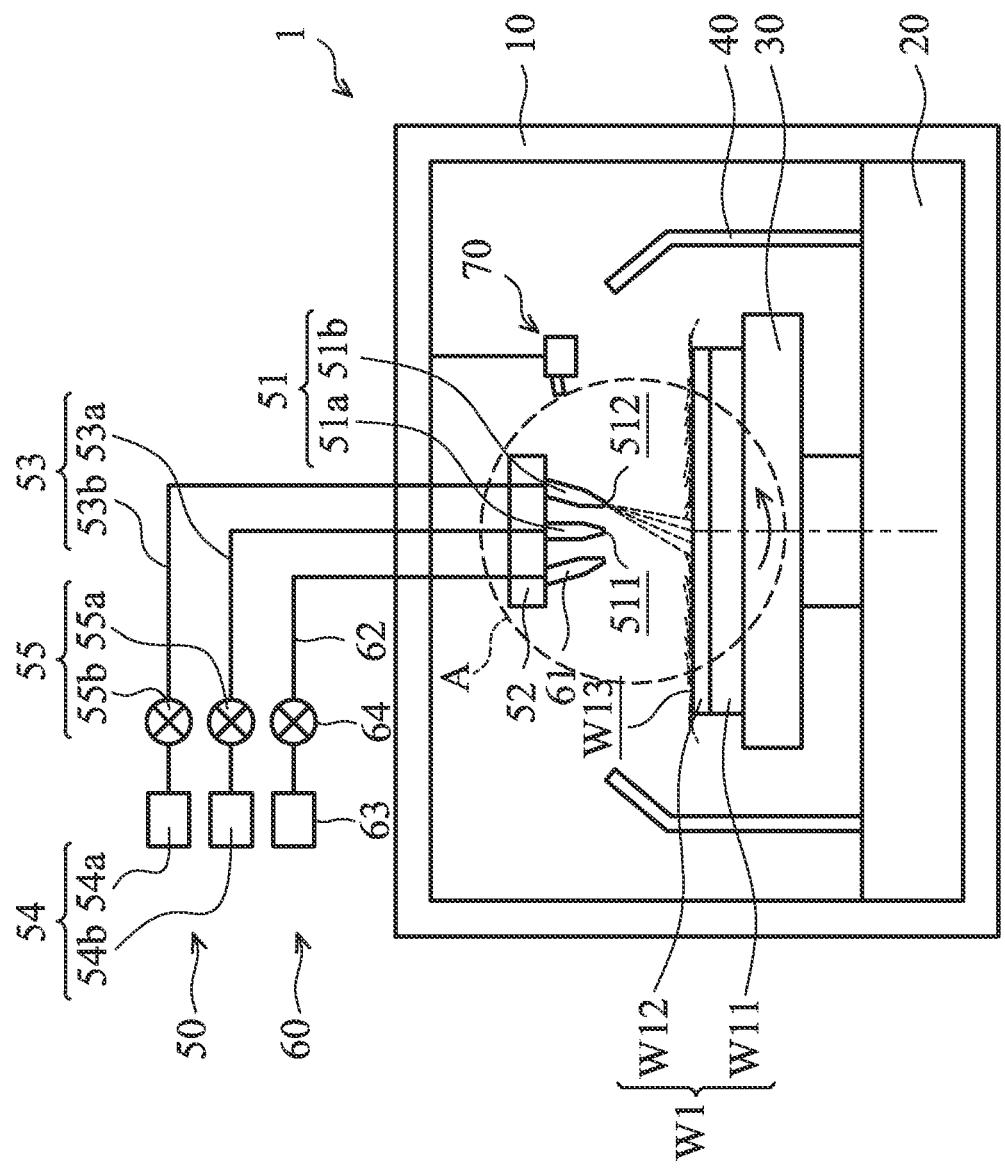
Figure 5C:
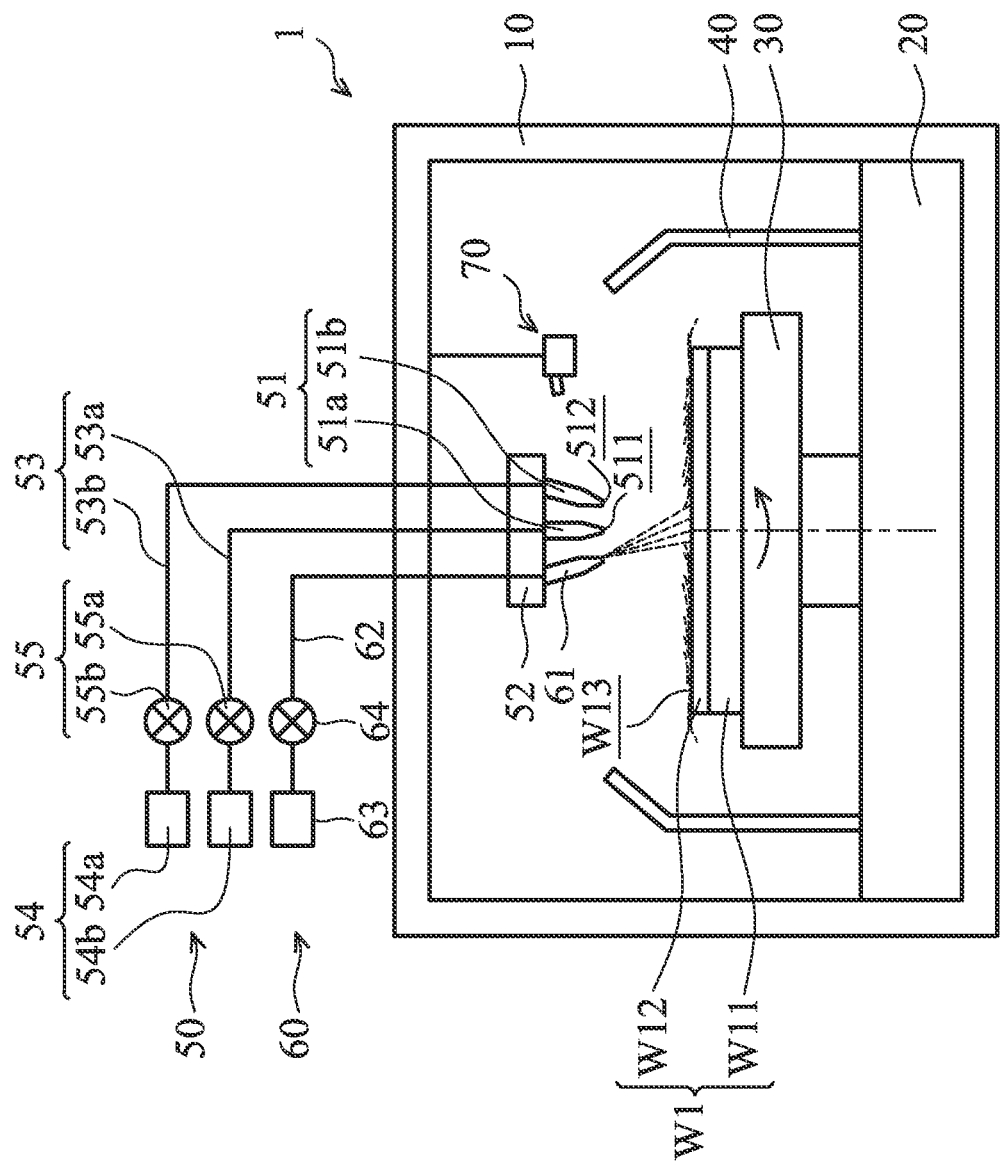
Figure 6:
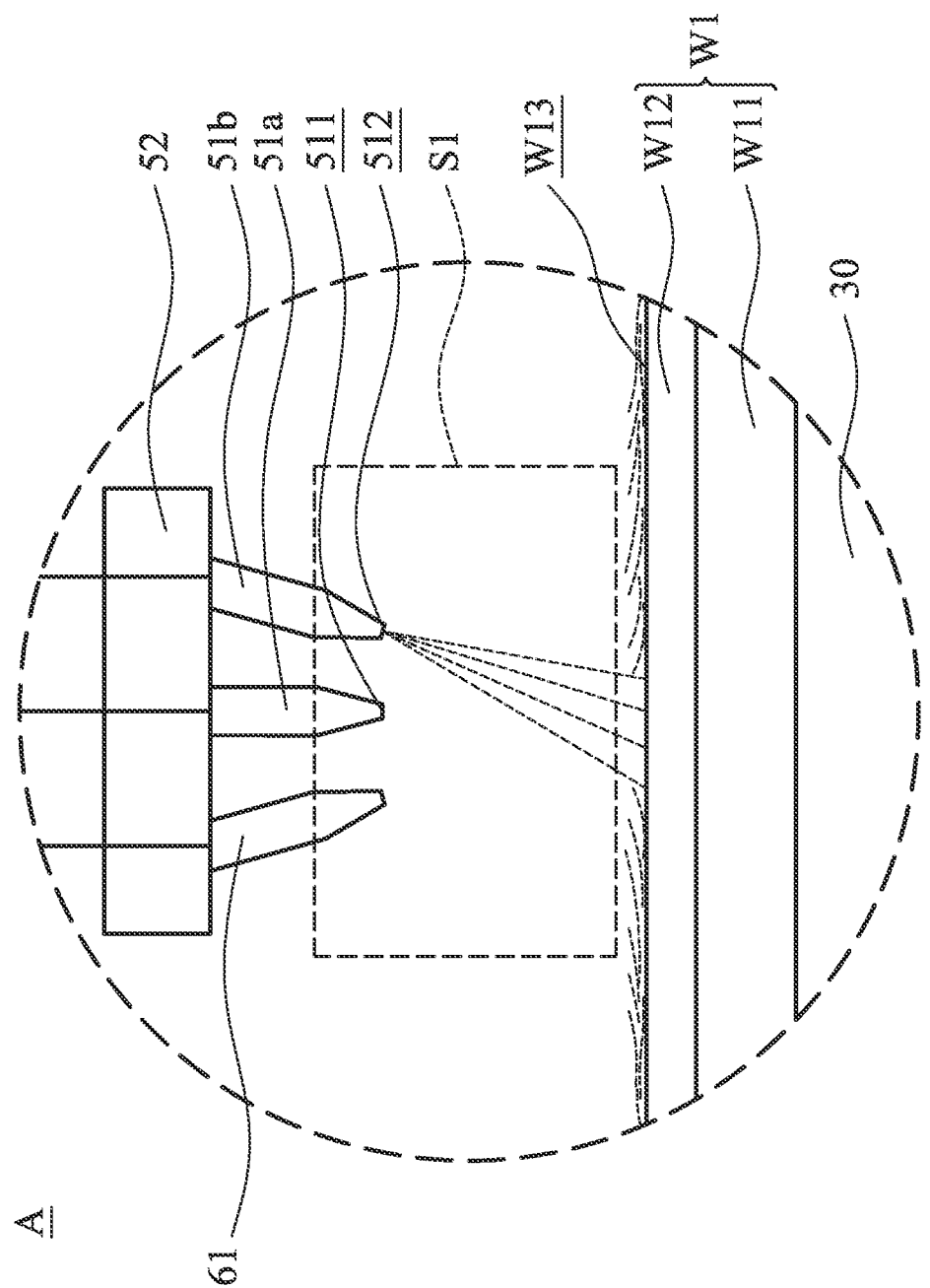
FIG. 6 is an enlarged view of part A of FIG. 5B.
Figure 7A:
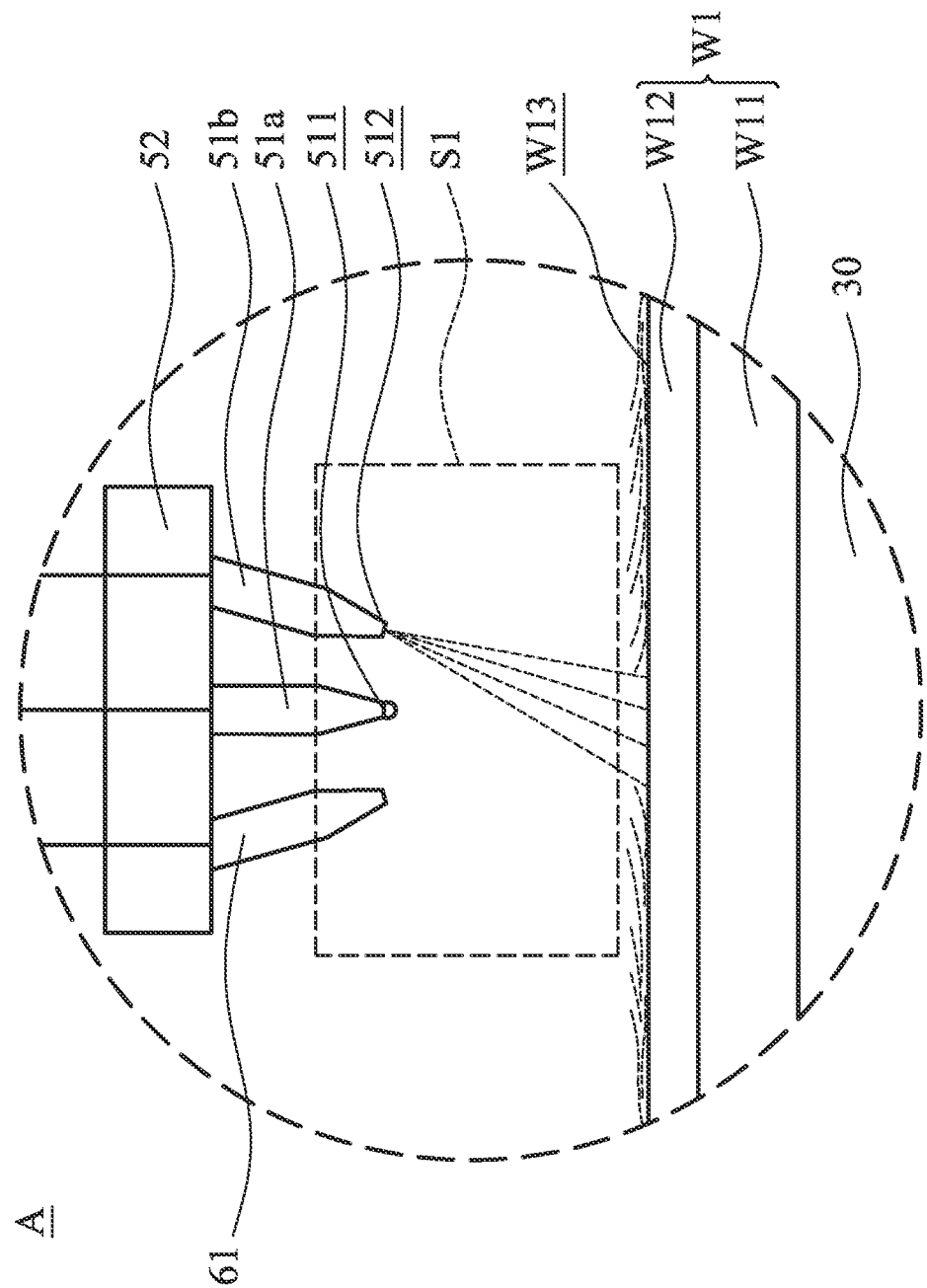
FIGS. 7A to 7B are enlarged views in accordance with some embodiments of FIG. 6.
Figure 7B:
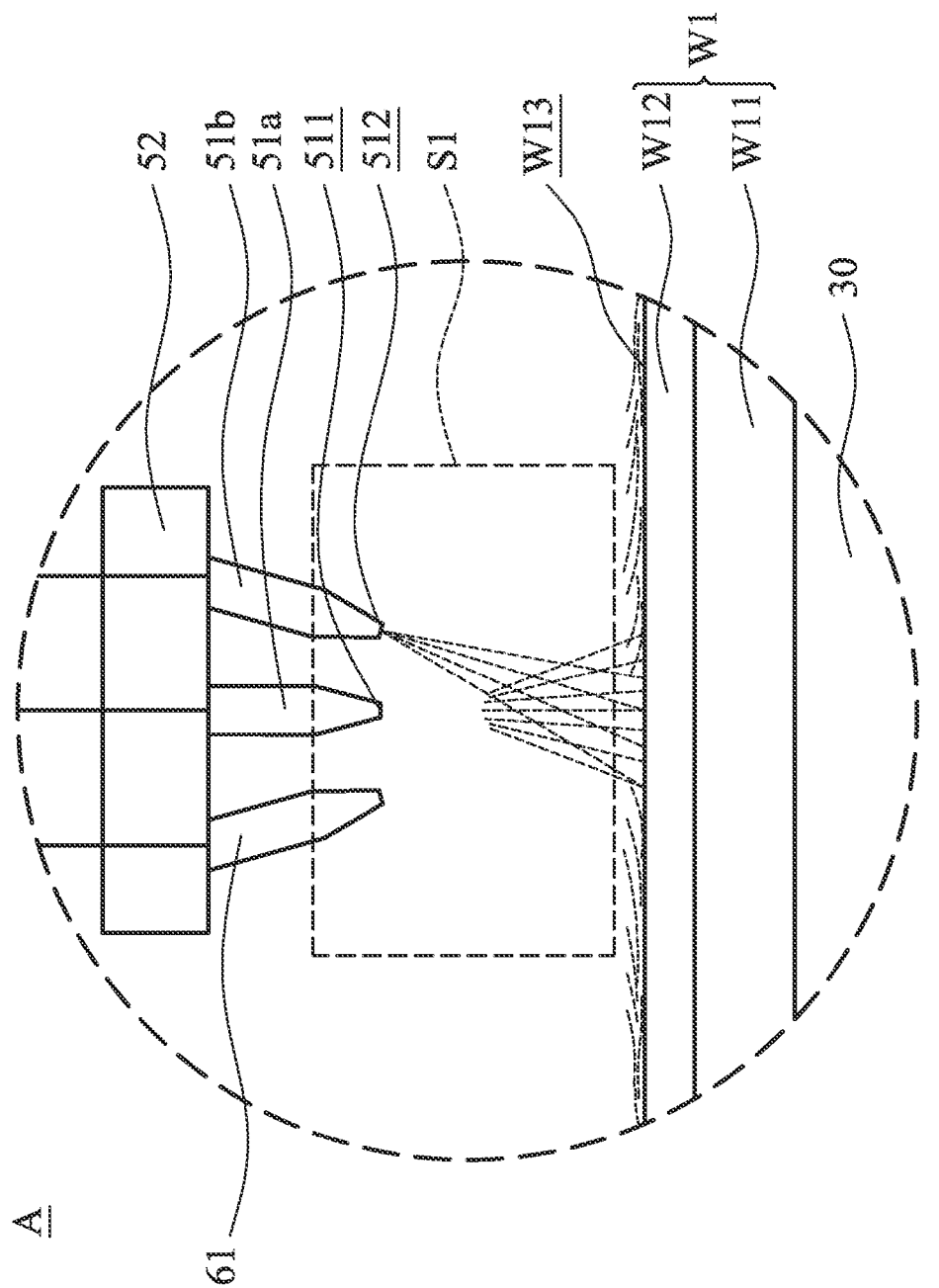

FIG. 4 is a flow chart of an adjustment method for the semiconductor apparatus 1 in accordance with some embodiments of the disclosure. FIGS. 5A to 5C are schematic views of a semiconductor apparatus 1 during an intermediate stage of the adjustment method in accordance with some embodiments of the disclosure. FIG. 6 is an enlarged view of the part A of FIG. 5B. FIGS. 7A to 7B are enlarged views in accordance with some embodiments of FIG. 6.

In step S101, the semiconductor apparatus 1 performs a semiconductor manufacturing process on the wafer W1. As shown in FIG. 5A, the wafer W1 is held on the wafer chuck 30. The first nozzle 51a is moved to the dispensing position close to the wafer W1. In some embodiments, the first nozzle 51a is located over the central area of the wafer W1.

As shown in FIGS. 2, 3, and 5A, afterwards, the process controller 80 controls the flow controller 55a to apply the first chemical liquid to the first nozzle 51a. Therefore, the first nozzle 51a starts to dispense the first chemical liquid onto the wafer W1 at the starting time T11.

In step S103, the processing module 90 controls the image device 70 to continually capture images of the first nozzle 51a and the second nozzle 51b in sequence in an image time period. While the image device 70 captures images of the first nozzle 51a and the second nozzle 51b, the processing module 90 continually receives the images from the image device 70.

In some embodiments, the image time period is in a range from about 0.0008 ($1/1200$) seconds to 0.2 seconds. The number of images taken by the image device 70 per second is in a range from about 5 to about 1200. In some embodiments, the number of images taken by the image device 70 per second is in a range from about 50 to about 800.

In some embodiments, the processing module 90 controls the image device 70 to continually capture images of the first nozzle 51a and the second nozzle 51b from the first nozzle 51a dispensing the first chemical liquid to the second nozzle 51b dispensing the second chemical liquid. In some embodiments, the image device 70 takes the images in sequence during the starting time T11 and the second stopping time T23.

In some embodiments, the image device 70 starts to capture images of the first nozzle 51a and the second nozzle 51b before the starting time T11, or before the first nozzle 51a starts to dispense the first chemical liquid onto the wafer W1.

In some embodiments, the image device 70 stops taking the images of the first nozzle 51a and the second nozzle 51b after the second dispensing time T22 or after the second nozzle 51b starts to dispense the second chemical liquid.

In step S105, as shown in FIG. 5A, the process controller 80 controls the flow controller 55a to stop applying the first chemical liquid to the first nozzle 51a. Therefore, the first nozzle 51a stops dispensing the first chemical liquid onto the wafer W1 at the first stopping time T12.

As shown in FIG. 6, the first chemical liquid is dispensed onto the wafer W1 via the opening 511 of the first nozzle 51a, and the second chemical liquid is dispensed via the opening 512 of the second nozzle 51b.

When the first nozzle 51a stops dispensing the first chemical liquid, the first chemical liquid protrudes over the opening 511 as shown in FIG. 7A. The first chemical liquid protruding over the opening 511 may drop on the wafer W1 later (especially when the first nozzle 51a is moved), and cause defects on the wafer W1.

Therefore, the flow controller 55a draws back a first volume of the first chemical liquid in the first nozzle 51a via the first tube 53a when the first nozzle 51a stops dispensing the first chemical liquid. In some embodiments, the first volume of the first chemical liquid is in a range from about 0.5 ml to about 300 ml.

After the flow controller 55a draws back the first volume of the first chemical liquid in the first nozzle 51a as shown FIG. 6, the first chemical liquid may not protrude over the opening 511.

In step S107, as shown in FIG. 5B, the process controller 80 controls the flow controller 55b to apply the second chemical liquid to the second nozzle 51b. Therefore, the second nozzle 51b starts to dispense the second chemical liquid onto the wafer W1 at the first dispensing time T21 after the first nozzle 51a stops dispensing the first chemical liquid.

For reducing the time required by the developing process, the time between the first nozzle 51a stopping the dispensing of the first chemical liquid and the second nozzle 51b starting to dispense the second chemical liquid is as short as possible. However, when the second nozzles 51b dispenses the second chemical liquid too early, the first chemical liquid and the second chemical liquid are mixed together in the space S1 between the wafer W1 and the first chemical liquid and the second chemical liquid. Therefore, some defects can form on the wafer W1 by the mixture of the first chemical liquid and the second chemical liquid in the space S1.

In some embodiments, the first chemical liquid and the second chemical liquid impacts to each other in the space S1, and make spray on the nozzles 51. Moreover, the first chemical liquid and the second chemical falling on the nozzles 51 will form particles. The particles may fall on subsequence wafers, and cause some defects on the wafers.

As shown in FIG. 6, an expectation condition is shown. When the second nozzle 51b starts to dispense the second chemical, the first chemical liquid does not flow to the wafer W1 in the space S1 close to the first and the second nozzles 51a and 51b.

In some embodiments, the space S1 is located above the first chemical liquid coated on the top surface W13 extending along a horizontal plane. In some embodiments, the space S1 is located above the first chemical liquid flowing on the top surface W13 of the wafer W1 along a horizontal plane.

In step S109, as shown in FIG. 5C, the process controller 80 controls the flow controller 55b to stop applying the second chemical liquid to the second nozzle 51b. Therefore, the second nozzle 51b stops dispensing the second chemical liquid onto the wafer W1 at the second stopping time T23.

The flow controller 55b draws back a first volume of the second chemical liquid in the second nozzle 51b via the second tube 53b when the second nozzle 51b stops dispensing the second chemical liquid.

Afterwards, the process controller 80 controls the flow controller 64 to apply the washing liquid to the nozzle 61. Therefore, the nozzle 61 starts to dispense the washing liquid onto the wafer W1 at the starting time T11.

Sine the wafer W1 is rotated, the washing liquid washes the top wafer W1 of the wafer W1 to remove the chemical liquid on the wafer W1. Furthermore, the process controller 80 controls the washing controller to stop applying the washing liquid to the nozzle 61. Therefore, the nozzle 61 stops dispensing the washing liquid onto the wafer W1 at the washing stopping time.

In step S111, the processing module 90 analyzes each of the images. The processing module 90 checks whether some defective features are shown in the images. Therefore, the reasons for the defects formed on the wafer W1 caused by the liquid supply device 50 can be detected by the monitor of the image device 70.

In some embodiments, each of the images corresponds to a shooting time. The shooting time is the time at which the image device 70 takes one of the images. The processing module 90 checks the images with the shooting times during the first dispensing time T21 and the second stopping time T23.

In some embodiments, a first defective feature is that the first chemical liquid and the second chemical liquid existing in the space S1 and flowing to the wafer W1 as shown in FIG. 7B. In some embodiments, the first defective feature further includes that the first chemical liquid is mixed with or interferes with the second chemical liquid in the space S1.

In some embodiments, a second defective feature is that the first chemical liquid protrudes over the opening 511 of the first nozzle 51a as shown in FIG. 7A. The portion of the first chemical liquid protruding over the opening 511 may drop on the wafer W1 later, and cause defects on the wafer W1.

If a defective feature is shown in one of the images, some defects may be formed on the wafers, and the liquid supply device 50 needs to be adjusted. In step S113, The processing module 90 performs an adjustment process when a defective feature is shown in one of the images. The image shown the defective feature is a defect image.

When the first defective feature are shown in a defect image, the second chemical liquid is mixed or interferes with the second chemical liquid in the space as shown in FIG. 7B. Therefore, the some defects may be formed on the wafers, and the first dispensing time T21 of the second nozzle 51b needs to be delayed.

In some embodiments, the processing module 90 adjusts the first dispensing time T21 when the defect image of the images shows the first defective feature. Moreover, the processing module 90 sets the second nozzle 51b dispensing the second chemical liquid at a second dispensing time T22 for subsequent semiconductor manufacturing processes.

In some embodiments, the processing module 90 takes control of the time for the second nozzle 51b to dispense the second chemical liquid. In some embodiments, the processing module 90 transmits a dispensing-adjustment signal to the process controller 80 to modify the first dispensing time T21 to the second dispensing time T22 in the control recipe 81.

In some embodiments, the second dispensing time T22 is determined by the first dispensing time T21 plus a predetermined time period. In some embodiments, the predetermined time period is in a range from about 0.001 seconds to 0.5 seconds.

In some embodiments, the processing module 90 sets the second nozzle 51b dispensing the second chemical liquid at a second dispensing time T22 according to the shooting time T4 of the defect image. The second dispensing time T22 is later than the first dispensing time T21.

In some embodiments, the processing module 90 analyzes the images further to find an image without the first defective feature after the shooting time T4. The image without the first defective feature is an expectation image.

In some embodiments, the expectation image is taken by the image device 70 at a shooting time T5. A delay time period T6 is the shooting time T5 minus shooting time T4. In some embodiments, the delay time period T6 is in a range from about 0.0008($\frac{1}{1200}$) seconds to about 2 seconds. Therefore, the second dispensing time T22 is calculated by the first dispensing time T21 plus the delay time. Moreover, by the calculation method of the second dispensing time T22, the time of the semiconductor manufacturing process increased by the delay time period T6 is minor.

Therefore, by the second nozzle 51b dispensing the second chemical liquid at the second dispensing time T22, the first chemical liquid does not mixed with or interferes with the second chemical liquid in the space S1 as shown in FIG. 6. The defects of the wafers made by the liquid supply device 50 are decreased in time for subsequence wafers.

In some embodiments, the processing module 90 adjusts the first volume when the defect image shows the second defective feature.

In some embodiments, the processing module 90 sets the first volume to a second volume, which is greater than the first volume. In some embodiments, the second volume is determined by the first volume plus an adjusting volume. In some embodiments, the adjusting volume is in a range from about 0.01 ml to about 0.1 ml.

In some embodiments, the processing module 90 takes control of the volume drawing using the flow controller 55a. In some embodiments, the processing module 90 transmits a drawing-adjustment signal to the process controller 80 to modify the first volume to the second volume in the control recipe 81. Therefore, the flow controller 55a draws back the second volume of the first chemical liquid in the first nozzle 51a when the first nozzle 51a stops dispensing the first chemical liquid in subsequence manufacturing processes.

By drawing back the second volume of the first chemical liquid in the first nozzle 51a by the flow controller 55a, the first chemical liquid does not over the opening 511 as shown in FIG. 6. Therefore, the defects of the wafers made by the liquid supply device 50 are decreased in time for subsequence wafers.

Embodiments of a semiconductor apparatus and an adjustment method for the semiconductor apparatus are provided. An image device is configured to monitor nozzles during a semiconductor manufacturing process. Some reasons for the defects formed on the wafer caused by the liquid supply device can be detected by the image device.

Moreover, the reasons for the defects formed on the wafer can be corrected according to the image captured by the image device in time for subsequence wafers processed by the semiconductor apparatus, and thus the yield rate of the wafers is improved. In addition, since some reasons for the defects formed on the wafer caused by the liquid dispensed by the nozzles can be found and corrected, the time required to find the reasons for the defects and to adjust the liquid supply device of the semiconductor apparatus is decreased.

In some embodiments, a semiconductor apparatus is provided. The semiconductor apparatus includes a wafer chuck configured to hold a wafer, and a first nozzle configured to dispense first chemical liquid onto the wafer. The semiconductor apparatus also includes a second nozzle configured to dispense second chemical liquid onto the wafer at a first dispensing time after the first nozzle stops dispensing the first chemical liquid. The semiconductor apparatus also includes an image device configured to take images of the first nozzle and the second nozzle in sequence, and a processing module configured to analyze the images. The processing module adjusts the first dispensing time when a first defect image shows the first chemical liquid and the second chemical liquid existing in a space close to the first and the second nozzles and flowing to the wafer.

In some embodiments, an adjustment method for a semiconductor apparatus is provided. The adjustment method includes dispensing a first chemical liquid by a first nozzle onto a wafer, and continually taking images of the first nozzle and a second nozzle in sequence by an image device. The adjustment method also includes dispensing a second chemical liquid by the second nozzle onto the wafer at a first dispensing time. The adjustment method also includes analyzing each of the images by a processing module, and conducting an adjustment process when a defective feature is found in a defect image.

In some embodiments, an adjustment method for a semiconductor apparatus is provided. The adjustment method includes dispensing chemical liquid onto a wafer via an opening by a nozzle, and stopping the dispensing of the chemical liquid. The adjustment method also includes drawing back a first volume of the chemical liquid in the nozzle by a flow controller when the nozzle stops dispensing the chemical liquid, and taking an image of the nozzle using an image device. The adjustment method also includes analyzing the images using a processing module, and adjusting the first volume with the processing module when the image shows the chemical liquid protrudes over the opening.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An adjustment method for a semiconductor apparatus, comprising:
   dispensing first chemical liquid by a first nozzle onto a wafer;
   continually taking images of the first nozzle and a second nozzle in sequence by an image device;
   dispensing second chemical liquid by the second nozzle onto the wafer at a first dispensing time;
   analyzing each of the images by a processing module; and
   processing an adjustment process when a first defective feature is shown in a first defect image of the images, wherein the first defective feature is that the first chemical liquid and the second chemical liquid existing in a space close to the first and the second nozzles, and flowing to the wafer,
   wherein the adjustment process further comprises adjusting the first dispensing time by the processing module.

2. The adjustment method as claimed in claim 1, further comprising continually taking the images of the first nozzle and the second nozzle in sequence by the image device from the first nozzle dispensing the first chemical liquid to the second nozzle dispensing the second chemical liquid.

3. The adjustment method as claimed in claim 1, further comprising:
   dispensing the first chemical liquid by the first nozzle onto the wafer at a starting time;
   stopping dispensing of the first chemical liquid at a first stopping time; and
   stopping dispensing of the second chemical liquid at a second stopping time,
   wherein the image device takes the images in sequence during the first starting time and the second stopping time, and the first dispensing time is later than the first stopping time.

4. The adjustment method as claimed in claim 1, wherein the first defective feature further comprises that the first chemical liquid is mixed or interferes with the second chemical liquid in the space.

5. The adjustment method as claimed in claim 1, further comprising: setting the second nozzle dispensing the second chemical liquid at a second dispensing time by the processing module according to a shooting time of the first defect image, wherein the second dispensing time is later than the first dispensing time.

6. The adjustment method as claimed in claim 5, wherein the image device stops taking the images of the first nozzle and the second nozzle after the second dispensing time or after the second nozzle starts to dispense the second chemical liquid.

7. The adjustment method as claimed in claim 1, further comprising:
drawing a first volume of the first chemical liquid in the first nozzle by a flow controller when the first nozzle stops dispensing the first chemical liquid,
processing the adjustment process when a second defective feature is shown in a second defect image of the images, wherein the first chemical liquid is dispensed via an opening formed on a bottom surface of the nozzle, and the second defective feature is that the first chemical liquid protrudes over the opening and the bottom surface,
wherein the adjustment process further comprises:
adjusting the first volume by the processing module.

8. The adjustment method as claimed in claim 7, further comprising:
setting the first volume to a second volume by the processing module, wherein the second volume is greater than the first volume.

9. The adjustment method as claimed in claim 8, wherein the second volume is determined by the first volume plus an adjusting volume, and the adjusting volume is in a range from about 0.01 ml to about 0.1 ml.

10. The adjustment method as claimed in claim 7, wherein the first volume of the first chemical liquid is in a range from about 0.5 ml to about 300 ml.

11. The adjustment method as claimed in claim 1, wherein the number of images taken by the image device per second is in a range from about 5 to about 1200.

12. The adjustment method as claimed in claim 1, further comprising:
holding the wafer on a wafer chuck; and
moving the first nozzle and the second nozzle to a dispensing positon close to the wafer and located over a central area of the wafer.

13. The adjustment method as claimed in claim 1, further comprising: continually taking the images of the first nozzle and the second nozzle in sequence by the image device in an image time period, which is in a range from about 0.0008 seconds to 0.2 seconds.

14. An adjustment method for a semiconductor apparatus, comprising:
dispensing first chemical liquid onto a wafer via an opening by a first nozzle, wherein the opening is formed on a bottom surface of the first nozzle;
continually taking images of the first nozzle and a second nozzle in sequence by an image device;
dispensing second chemical liquid by the second nozzle onto the wafer at a first dispensing time;
stopping dispensing of the first chemical liquid;
drawing back a first volume of the first chemical liquid in the first nozzle by a flow controller when the first nozzle stops dispensing the first chemical liquid;
analyzing each of the images by a processing module;
adjusting the first volume by the processing module when one of the images shows the first chemical liquid protrudes over the opening and the bottom surface; and
processing an adjustment process when a first defective feature is shown in a first defect image of the images, wherein the first defective feature is that the first chemical liquid and the second chemical liquid existing in a space close to the first and the second nozzles, and flowing to the wafer,
wherein the adjustment process further comprises adjusting the first dispensing time by the processing module.

15. The adjustment method as claimed in claim 14, further comprising:
setting the first volume to a second volume by the processing module, wherein the second volume is greater than the first volume.

16. The adjustment method as claimed in claim 15, wherein the second volume is determined by the first volume plus an adjusting volume, and the adjusting volume is in a range from about 0.01 ml to about 0.1 ml.

17. The semiconductor method as claimed in claim 14, wherein the number of images taken by the image device per second is in a range from about 5 to about 1200.

18. The adjustment method as claimed in claim 14, further comprising:
holding the wafer on a wafer chuck; and
moving the first nozzle to a dispensing positon close to the wafer and located over a central area of the wafer.

19. The adjustment method as claimed in claim 14, wherein the first volume of the first chemical liquid is in a range from about 0.5 ml to about 300 ml.

* * * * *